US009530029B2

United States Patent
Jadeau et al.

(10) Patent No.: US 9,530,029 B2
(45) Date of Patent: Dec. 27, 2016

(54) METHOD FOR PRODUCING A MEMORY-CARD-READING BODY, CORRESPONDING MEMORY-CARD-READING BODY AND MEMORY-CARD-READING TERMINAL

(71) Applicant: INGENICO GROUP, Paris (FR)

(72) Inventors: Johann Jadeau, Bourg-les-Valence (FR); Stephane Pavageau, La Roche de Glun (FR)

(73) Assignee: INGENICO GROUP, Paris (FR)

( * ) Notice: Subject to any disclaimer, the term of this patent is extended or adjusted under 35 U.S.C. 154(b) by 0 days.

(21) Appl. No.: 15/033,830

(22) PCT Filed: Oct. 24, 2014

(86) PCT No.: PCT/EP2014/072824
§ 371 (c)(1),
(2) Date: May 2, 2016

(87) PCT Pub. No.: WO2015/062982
PCT Pub. Date: May 7, 2015

(65) Prior Publication Data
US 2016/0275317 A1    Sep. 22, 2016

(30) Foreign Application Priority Data

Oct. 31, 2013  (FR) ...................... 13 60708

(51) Int. Cl.
*G06K 7/00* (2006.01)
*H05K 1/02* (2006.01)
(Continued)

(52) U.S. Cl.
CPC ............. *G06K 7/0078* (2013.01); *H05K 1/028* (2013.01); *H05K 1/0275* (2013.01);
(Continued)

(58) Field of Classification Search
CPC .... G06K 7/0078; G06K 7/0013; H05K 1/028; H05K 1/0275; B29C 45/14639; B29K 2995/0011; B29K 2069/00; B29K 2995/0005; B29L 2031/3481
See application file for complete search history.

(56) References Cited

U.S. PATENT DOCUMENTS

2009/0302109 A1* 12/2009 Kerner ................. G06K 7/0013
235/439
2009/0321302 A1  12/2009 Dubois et al.

FOREIGN PATENT DOCUMENTS

FR        2906623 A1    4/2008

OTHER PUBLICATIONS

International Search Report and Written Opinion dated Dec. 17, 2014 for corresponding International Application No. PCT/EP2014/072824, filed Oct. 24, 2014.

* cited by examiner

*Primary Examiner* — Kristy A Haupt
(74) *Attorney, Agent, or Firm* — David D. Brush; Westman, Champlin & Koehler, P.A.

(57) ABSTRACT

A method is provided for producing a memory-card-reading body having a generally rectangular parallelepiped shape, including a slot for inserting a memory card, and including, on a rear face, a receiving element for receiving a memory card connector. The receiving element has a predetermined volumetric shape. The method includes the following successive steps: production of a flexible printed circuit including at least two areas which are an area including at least one strip conductor, and at least one contact area; and formation of the receiving element by overmoulding the flexible printed circuit.

10 Claims, 6 Drawing Sheets

(51) Int. Cl.
*B29C 45/14* (2006.01)
*B29K 69/00* (2006.01)
*B29L 31/34* (2006.01)

(52) U.S. Cl.
CPC .... *B29C 45/14639* (2013.01); *B29K 2069/00* (2013.01); *B29K 2995/0005* (2013.01); *B29K 2995/0011* (2013.01); *B29L 2031/3481* (2013.01)

METHOD FOR PRODUCING A MEMORY-CARD-READING BODY, CORRESPONDING MEMORY-CARD-READING BODY AND MEMORY-CARD-READING TERMINAL

1. CROSS-REFERENCE TO RELATED APPLICATIONS

This application is a Section 371 National Stage Application of International Application No. PCT/EP2014/072824, filed Oct. 24, 2014, the content of which is incorporated herein by reference in its entirety, and published as WO 2015/062982 A1 on May 7, 2015, not in English.

2. FIELD OF THE INVENTION

The invention is situated in the field of memory card readers. The object of the invention more particularly is a memory card reader comprising a memory card connector (MCC) to be inserted into a memory card reading terminal.

Such a terminal can be a payment terminal, an identification terminal. More generally, the invention pertains to any type of terminal that can comprise a memory card reader.

3. PRIOR ART

Memory card reading terminals comprise not only a memory card reader but also a certain number of components such as a keyboard, a screen, one or more processors, a memory, an electrical power supply source.

Over the past several years, the functions of these terminals have greatly increased in number. This is especially true for payment terminals.

Thus, in addition to the payment function, the terminals embed network communications functions, contactless memory card detection functions, token (for example loyalty token) managing functions, etc.

In addition to the great increase in the numbers of such auxiliary functions, the terminals must also withstand the various attacks or attempts at fraud to which they are often subjected. Thus, in order to obtain homogeneity of resistance to attack in terminals, international standards have been promulgated. In the field of payment, the PCI PED (Payment Card Industry—Pin Entry Device) standard lays down requirements in terms of intrusion and the detection of attempted attacks on terminals. This is not the only standard in force.

However, because of these standards, terminals which previously had little protection are gradually being replaced by increasingly secured terminals. Among the different aspects related to the securing of the terminals, industrialists in the sector are paying more special attention to protecting the memory card reader. The memory card reader indeed is a relatively weak link in the memory card reading terminal. This is due to the fact that the memory card reader has a slot for inserting the memory card, and this slot makes the interior of the terminal accessible from the exterior.

Attackers more particularly seek to obtain access to the memory card connector.

The memory card connector is that part of the memory card reader that comes into contact with the chip and the microprocessor embedded in the memory card.

Referring to FIG. 1, we describe a classic assembly of a memory card reader. This memory card reader comprises a memory card reader body 10 having a slot 11 for inserting a memory card. The memory card connector is directly integrated into the memory card reader. It comprises connection pins 12 for connection to the printed circuit board (PCB) 13 (seen in a partial view). The PCB 13 also has electronic components 14. To protect the memory card reader 10, it is covered with an element 15 providing full protection as well as a front protection.

When an attacker manages to obtain access to this memory card connector without being spotted by anyone, he can then intercept and read the data exchanged between the chip or the microprocessor of the card and the processor of the memory card reading terminal. Among the pieces of data intercepted, we can cite especially the secret code entered by the customer. In certain smart cards, this secret code can be conveyed without encryption.

This explains why numerous efforts have been made to secure the memory card reader. Thus, for example, memory card readers have been provided with a lattice protection. This protection prevents the introduction by the drilling of the terminal. When an object tries to penetrate the protective enclosure, a short circuit is produced causing the terminal to be put out of service.

These efforts to protect terminals have led to high complexity of manufacture, and the cost of manufacture has also increased. At present, the requirements of the prevailing standards in terms of security standards are such that, to manufacture a read terminal, it is necessary to provide for a mix of numerous steps entailing, at the same time, the sequenced soldering of components, the need to have available components resistant to re-melting, etc. In addition to the complexity of manufacture of the terminal, these methods make the maintenance of the terminals produced highly complex or even impossible, thus giving rise to many difficulties, as much for the maintenance service providers as for the manufacturers of the memory card reading terminal.

In order to mitigate the complexity of manufacture in the prior art, another assembly has been proposed and is illustrated in FIGS. 2A and 2B, FIG. 2B. These figures especially illustrate the fact that the reception housing 220 for the memory card connector comprises at least one conductive track 23.

As compared with the classic assembly configuration illustrated in FIG. 1, this approach represented by FIG. 2 makes it easier to mount the assembly, the memory card connector 10 being independent of the body of the memory card reader 20.

Thus, according to this proposal, the memory card connector 22 is not assembled with the body of the memory card reader 20 and then assembled with the printed circuit board (PCB) of the reading terminal. The technique described proposes firstly to affix the memory card connector 22 to the PCB and then to affix the body of the memory card reader 20 over the connector 22. In other words, it will be understood that this assembly is not at all of the same nature as the assembly of FIG. 1 since the memory card connector is covered by the body of the memory card reader which protects it so to speak.

According to one embodiment of this assembling configuration, in the body of the memory card reader 20, the reception housing 220 of the memory card connector comprising at least one conductive track is a part molded by thermoplastic injection in which the electronic circuit tracks are integrated in three dimensions during injection, such a reception housing being hereafter called a reception housing or MID (Molded Interconnection Device) part. The 3D conductive tracks of the MID reception housing 220 therefore play the role of a lattice for protecting the memory card connector, especially the input/output signal (I/O signal) travelling between the memory card (smartcard) and the memory card connector, and for protecting the components located in proximity to the path of the I/O signal, and located in proximity to a microprocessor.

More particularly, according to this configuration, the MID reception housing 220 of the memory card connector, located in the body of the memory card reader 20, protects two surfaces in opposite parts. Indeed, a laser etching is made in order to produce 3D electronic tracks 23.

To integrate such conductive tracks within the part, a laser etching technique is for example used.

More specifically, among the known laser etching techniques, the technique for using a thermoplastic material doped with an activated metal-plastic additive by means of a laser is used and is known as LDS (Laser Direct Structuring).

In addition to the fact that the technique for manufacturing MID parts is relatively costly to implement, the drawback of such an MID part used to house the memory card connector in the memory card reader body lies in its low resistance to climatic conditions such as cold or humidity and also its low resistance to friction from the insertion/withdrawal of the memory cards.

To overcome this drawback, the deposition of a protective varnish or a spacing between the MID and the location of the card passage called an "impacted thickness" are for example implemented but these approaches increase the cost and time of manufacture accordingly.

In addition, holes are provided in the laser-etched printed circuit board in order to insert "elevation pins" 24 setting up a distance between the MID reception housing track or tracks and the memory card which will be inserted/withdrawn.

In addition, it must be noted that a malicious third party could drill the memory card reader body at the very position of these elevation pins in order to attain and damage the memory card connector or memory card itself. It is therefore necessary for the position of these holes within the circuit of the protection lattice not to correspond to the position of the components and/or the path of the signals to be protected.

Planning for these holes and their location in the protection lattice therefore makes its designing more complicated.

Besides, the changes in the etching of the MID can also lead to zones without tracks on a height H as shown in FIG. 2B. As a consequence, the printed circuit board of the protection lattice of the MID reception housing 220 is complex since the conductive tracks 23 are diverted to prevent a "drop" or "break" (interruption), also called a "step" formed by the change in level 25 of a height H.

There is therefore a need to provide a novel technique for manufacturing a memory card reader body of a reception housing for memory card connectors free of technical restrictions, the complexity and costs of implementation of which are limited, in order to provide memory card connector housings that are resistant to all climatic conditions, especially humidity, and to friction due to the insertion/withdrawal of memory cards.

4. SUMMARY OF THE INVENTION

The technique described proposes a novel solution that does not have at least some of the drawbacks of the prior art, in the form of a method for manufacturing a memory card reader body with a generally rectangular parallelepiped shape comprising a slot for inserting a memory card, one rear face of which comprises a reception housing for a memory card connector, said reception housing being of predetermined volume shape.

According to the technique described, said method for manufacturing comprises the following successive steps:
  obtaining a flexible printed circuit board comprising at least two zones:
    a zone comprising said at least one conductive track forming a protection lattice capable of detecting an intrusion, and
    at least one contact zone,
  forming said reception housing by overmolding on said flexible printed circuit board.

Thus, the technique described proposes the use of a flexible printed circuit board as a protection lattice of the reception housing of a memory card connector. The flexible printed circuit board according to the technique described is then protected and made immobile within the memory card reader body by overmolding.

The overmolding enables at least a part of the protection lattice formed by the conductive tracks of the flexible printed circuit board to be made invisible and therefore to be protected against unfavorable climatic conditions such as humidity, cold or again friction from the insertion/withdrawal of memory cards.

Indeed, the overmolding on the flexible printed circuit board efficiently protects the protection lattice of the flexible printed circuit board because the overmolding layer faithfully matches the entire flexible printed circuit board and fulfils the same function as the protection varnish added to a prior-art MID part while reinforcing its efficiency against abrasion since the thickness of the overmolding can be some tenths of a millimeter (0.5 to 1 mm) as compared with a few microns (10 to 50 μm) for the varnish, which therefore means that the latter has a thickness that is 20 to 50 times smaller.

Thus, the technique described limits the number of operations needed to insert and protect a protection lattice in the reception housing of a memory card connector.

Indeed, as compared with the prior-art MID technique which requires at least three major steps of manufacture illustrated in FIG. 2C, namely the injection 201 of plastic into a specific activable material, laser etching 202 enabling the metallization to cling or adhere, the costly and complex metallization 203 of tracks, by successive baths of distinct metals (Copper Cu, Nickel Ni, or Au, etc.) of a part of the memory card reader body and finally protection by varnish, the technique described enables the manufacture of a high-performance and resistant memory card reader body by overmolding on a flexible printed circuit board.

Thus, the technique described differs from the prior-art MID technique in that, instead of seeking to insert a protection lattice on an already existing reception housing, the reception housing according to the present technique is manufactured by overmolding it onto a protection lattice of an existing flexible printed circuit board, the overmolding furthermore enabling the protection lattice to be covered and therefore protected.

The technique described therefore does away with any constraint of etching related to the relief of the reception housing of a memory card connector whereas in the prior art regarding the MID technique, it was necessary to divert conductive tracks in the event of "drops", also called "steps" of the reception housing of the memory card connector such as for example that of the height H shown in FIG. 2B.

On the contrary, according to the technique proposed here, the conductive tracks of the protection lattice are disposed on the flexible printed circuit board, the shape or relief of which shall be fixed during the overmolding step. Thus, as compared with the MID technique where a printed circuit board is etched in an existing reception housing, the relief of which is fixed and requires the adaptation of the printed circuit board by diverting tracks, the technique described herein is simple and has low complexity in its implementation and can easily be carried out on an industrial scale because the shape of the flexible printed circuit board is adapted to the overmolding step forming the reception housing of the memory card connector according to the invention.

The technique described thus provides savings in the cost of implementation of the prior-art MID technique while at the same time being simple to implement and resistant in time to climatic conditions, friction or other sources of wear and tear of the memory card reader body or vandalism against it.

According to one particular aspect of the technique described, the method of manufacture comprises a step for cutting out the flexible printed circuit board.

This cutting-out step makes it possible especially to adapt the shape or the volume of the memory card reader body manufactured according to the invention, this shape possibly varying from one memory card reader model to another.

Indeed, a particular memory card reader model "dictates" a shape of the reception housing constituting the memory card reader body. Since, according to the technique proposed herein, the reception housing constituting the memory card reader body is obtained by overmolding on the flexible printed circuit board, the desired shape of the reception housing also "dictates" a "pre-shaping" of the flexible printed circuit board obtained, in this embodiment, by cutting out.

Thus, this cutting-out step offers a high flexibility of manufacture.

In addition, such a cutting-out step may enable the serializing of the manufacture of a memory card reader body according to the technique presented. Indeed, it can be useful to produce a "large" flexible printed circuit board which can be cut out to provide several flexible printed circuit boards intended for the manufacture, by overmolding, of an equivalent number of memory card reader bodies.

According to one particular aspect of the described technique, said step for shaping said reception housing by overmolding on said flexible printed circuit board comprises a step of fixedly attaching a rigid plate beneath said flexible printed circuit board, said step for fixedly attaching being implemented prior to said overmolding.

Such a plate is for example a metal plate used to prevent undesirable deformation during the overmolding.

According to one particular aspect of the technique described, the method of manufacture comprises a step for drilling at least one positioning aperture in the flexible printed circuit board, the positioning aperture being taken into account for the step for shaping the reception housing by overmolding on the flexible printed circuit board and/or a step for folding (34) said flexible printed circuit board.

The step of drilling improves the precision of localization of the flexible printed circuit board in the mold used for the overmolding.

This embodiment of the proposed technique increases the precision of the overmolding but above all the precision of location of the tracks required to ensure efficient connection, the contact zone, also called a connection zone, of the flexible printed circuit board, bearing the protection lattice that has to be positioned so as to be facing the connection zone of the circuit dedicated to the electronic components fulfilling the electronic function of the memory card reader such as the memory card connector to which the reader body is adapted.

For example, a positioning aperture is disposed in the connection zone and another positioning aperture is located in the zone comprising the conductive track or tracks forming the protection lattice.

The positioning aperture located in the connection zone is vital to the positioning aperture located in the zone comprising the conductive track or tracks forming the protection lattice because the securing of the circuit, dedicated to the electronic components providing for the electronic working of the memory card reader, is made more reliable by it.

It must be noted that, unlike the apertures implemented according to the MID technique to insert "raising pins" in order to set up a distance between the MID reception housing track or tracks and the memory card so as to prevent friction between the memory card and the tracks of the protection lattice of the reception housing, this positioning aperture is located at a selected position so that no subsequent intrusion, especially a fraudulent intrusion, is possible or effective through this aperture.

The folding step also enables a "pre-shaping" of the flexible printed circuit board in order to more easily obtain the desired shape of the reception housing constituting the memory card reader body at the end of the overmolding step and may be combined or not combined with a cutting step for cutting out the flexible printed circuit board as described here above.

The step for folding the flexible printed circuit board is therefore done before the overmolding step. It improves the quality of the overmolding and maintains the resistance of the copper tracks during injection. Indeed, the folding defines tabs or recesses in the flexible printed circuit board so that the circuit can adhere more efficiently to the mold of the overmolding operation and so that the position of the flexible printed circuit board during the injection under pressure is fully controlled. For example, a "vertical" fold prevents lateral access and a "horizontal" fold protects the card.

Such a fold therefore shapes the changes in level corresponding to the changes in levels of the memory card reader body model that is to be obtained. After the folding step, it is possible to verify the overall covering of the relief thus obtained by the protection lattice for the flexible printed circuit board.

Indeed, according to the technique proposed here, it is no longer necessary to divert the conductive tracks to prevent changes in level as practiced in the prior-art MID technique. Thus, according to the technique proposed herein, the covering of the protection lattice is comprehensive. In other words, the drops (or "steps") in the relief of the reception housing are covered by one or more conductive tracks and the folding step furthermore makes it possible to verify that no conductive track has been damaged by the folding and the subsequent and definitive folding which will take place by application of the overmolding step.

According to one particular aspect of this embodiment, said at least one aperture for positioning is located in proximity to at least one edge of said flexible printed circuit board and at a minimum distance of 10 mm from said at least one conductive track.

Thus, the positioning aperture according to the invention is placed far enough from the protection lattice for this protection lattice to offer overall cover beneath the reception housing surface intended to receive the memory card connector.

Thus, this aspect of the technique proposed herein is clearly distinguished from the MID technique where the protection lattice is drilled by the insertion of "raising pins" in order to set up a distance between the MID reception housing track or tracks and the memory card. According to the MID technique, the distance between a hole located in the core of the protection lattice and a conductive track of the protection lattice is 2.5 mm. Thus, the MID technique requires the diversion of the conductive tracks around the aperture. On the contrary, according to the present technique, the positioning holes are situated outside the lattice. It is therefore impossible to introduce anything therein once the overmolding is done and even when these apertures are at a sufficient distance from the protection lattice so as not to modify the detection of intrusion which is the purpose of its implementation.

In addition, the MID technique, owing to its structure, is a single-face technology. The flexible printed circuit board according to the technique described herein offers more possibilities, namely the implementing of a two-face circuit with a ground plane used to prevent drilling without in any way thereby shorting the mass and the lattice or even the implementing of a multilayer circuit comprising several superimposed lattice layers.

According to one particular aspect of the present technique, said overmolding is such that:
  said zone comprising at least one conductive track is covered with an overmolding material on both its faces,
  said contact zone is covered with an overmolding material on only one face.

Thus, the overmolding completely protects the protection lattice apart from the contact zone which will thereafter be covered by and connected to the memory card connector.

It must be noted that such a contact zone comprises for example the connection pins of the protection lattice which will be connected to the circuit dedicated to the electronic components providing for the electronic functioning of the electronic device, by means of an elastomer connector, for example of the Zebra (Registered Mark) type.

According to another aspect of the technique described, the overmolding material is a conductive or dissipative material.

This characteristic of the overmolding material makes it possible for example to dissipate the electrostatic charges during the insertion of the memory card into the memory card reader body.

For example, this overmolding material is a conductive polycarbonate.

According to another aspect, the described technique also relates to a generally rectangular parallelepiped shaped memory card reader body comprising a slot for inserting a memory card, a rear face of which comprises a reception housing for a memory card connector, said reception housing having a predetermined volume shape.

According to the technique described, said reception housing is an overmolding of flexible printed circuit board comprising at least two zones:
  a zone comprising said at least one conductive track forming a protection lattice capable of detecting an intrusion, and
  at least one contact zone.

The advantages of this reader body are the same as those presented with reference to the method of manufacture according to the technique described and seek to propose a memory card reader body obtained by overmolding on a flexible printed circuit board comprising at least one conductive track forming a protection lattice. These advantages are therefore not described in more ample detail. In particular, such a memory card reader body is reliable because the protection lattice that it contains is protected by the overmolding material.

According to one variant, such a memory card reader body comprises at least one positioning aperture in said flexible printed circuit board. Thus, if the memory card reader body is disassembled, the technique presented will be easily identifiable because of the presence of the aperture in the flexible printed circuit board of the memory card reader body.

In addition, according to another variant, such a reader body comprises a rigid plate fixedly attached beneath said flexible printed circuit board, prior to the implementing of the overmolding.

Thus, the superimposing of the flexible printed circuit board and of the rigid plate will be overmolded reliably in preventing potential deformation of the flexible printed circuit board related to the injection pressure during the overmolding.

According to another aspect, the described technique also relates to a memory card reading terminal comprising a card reader body as described here above.

5. FIGURES

Other features and advantages of the technique described shall appear more clearly from the following description of a preferred embodiment, given by way of a simple, illustratory and non-exhaustive example, and from the appended drawings of which:

FIG. 1 already presented describes the classic architecture of a memory card reader;

FIGS. 2A to 2C already presented respectively describe the architecture of another memory card reader, an MID part constituting it according to the prior art relative to this assembly configuration and the steps implemented according to the MID technique;

6. DETAILED DESCRIPTION OF THE INVENTION 6.1 Reminder of the Principle of the Invention The general principle of the technique described consists of the use of a flexible printed circuit board to manufacture a memory card reader body comprising a reception housing for a memory card connector overmolded onto the flexible printed circuit board.

Thus, the protection lattice formed by the conductive track or tracks of the flexible printed circuit board is itself protected by the overmolding against climatic conditions which are sources of wear and tear, for example climatic conditions such as cold, moisture, or against friction from the insertion and withdrawal of the memory card.

Figure 1:
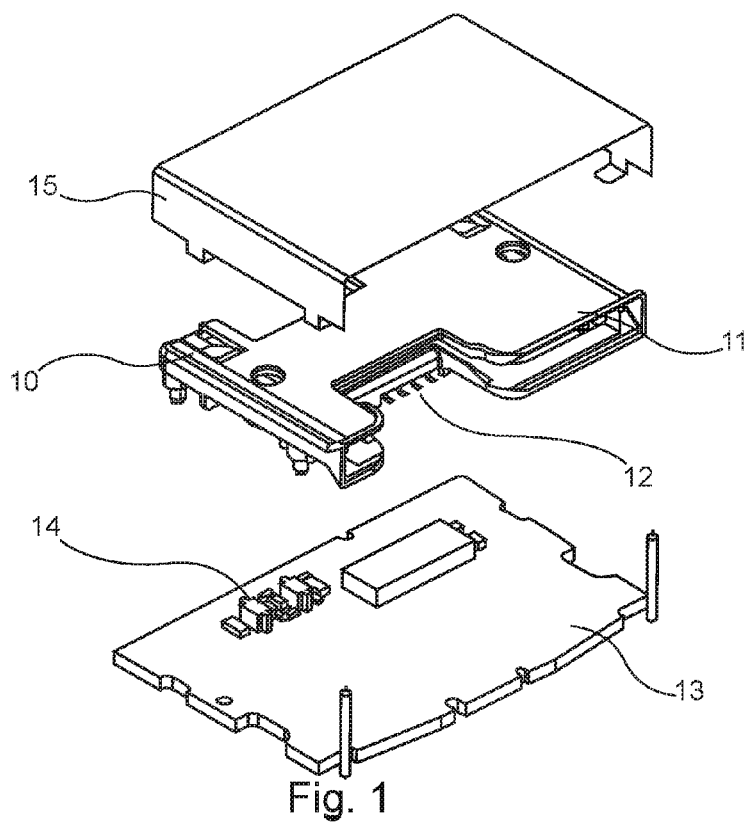
Figure 2A:
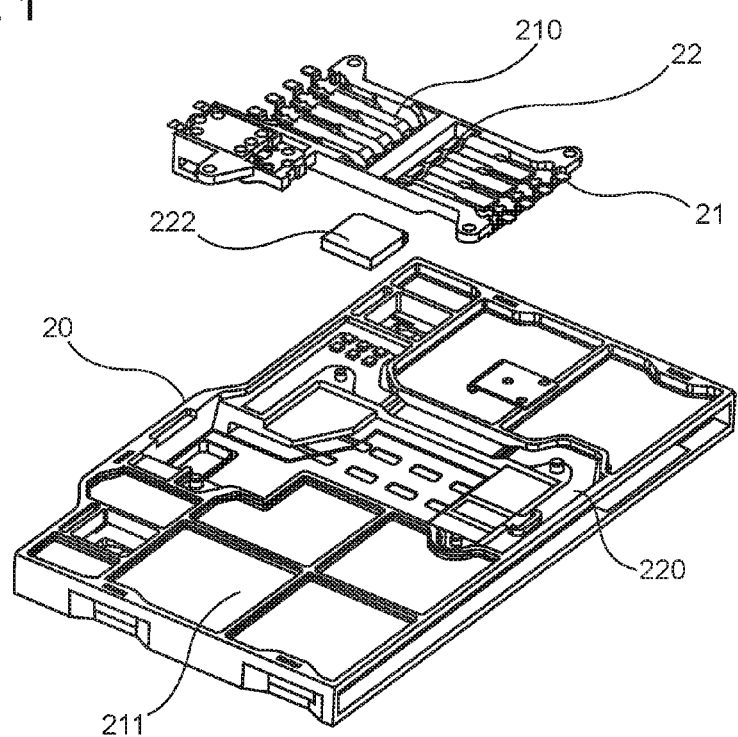
Figure 2B:
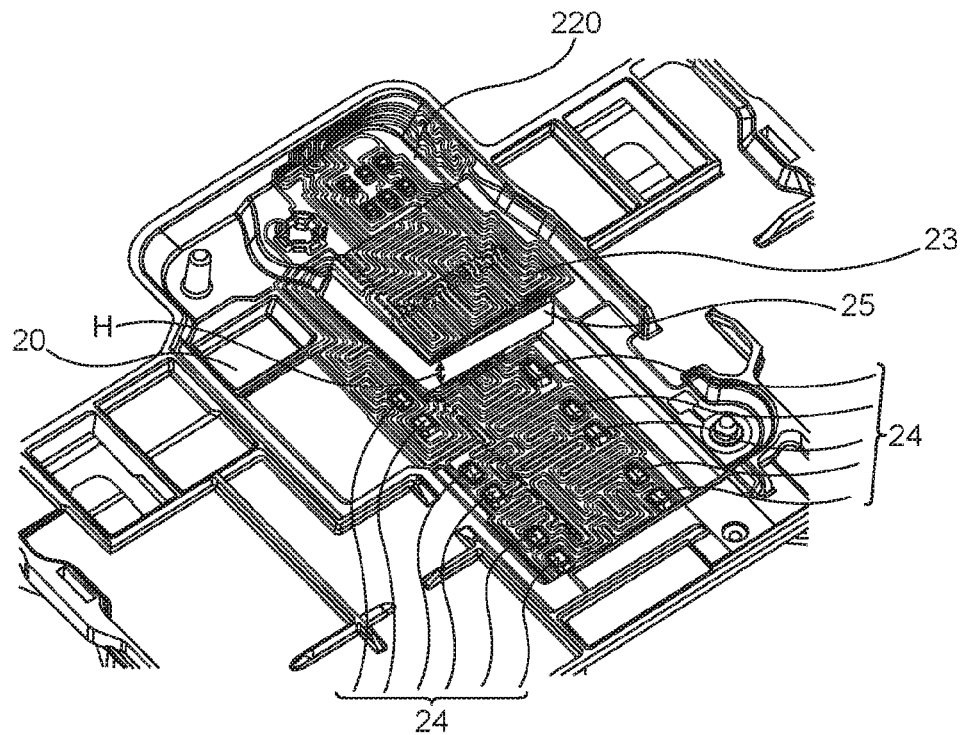
Figure 3:
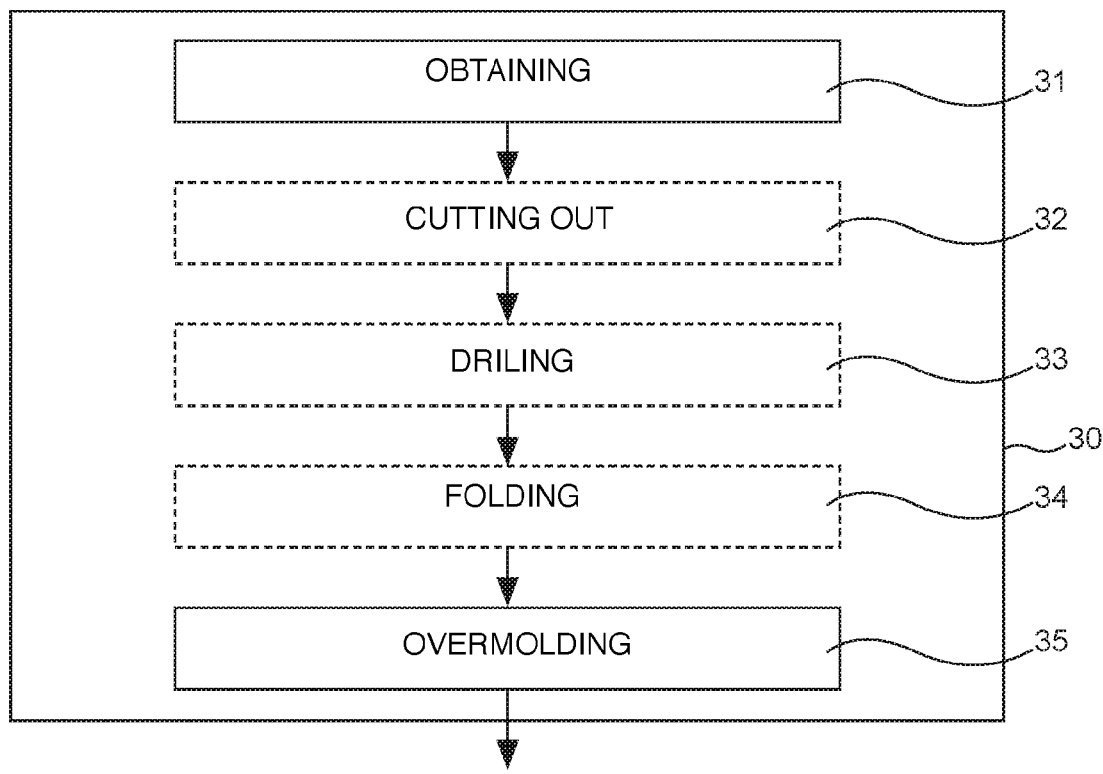
FIG. 3 illustrates the method of manufacture according to the described technique.

The general principle of the technique described is described with reference to FIG. 3 illustrating the method of manufacture 30. FIGS. 4A to 4E also illustrate the results of the different steps of the method of manufacture according to the invention.

Such a method essentially comprises the following two steps:
- obtaining (31) a flexible printed circuit board (41) comprising at least two zones:
  - a zone (420) comprising at least one conductive track (42), also called a protection lattice, and
  - at least one contact zone (44),
- forming the reception housing (40) of a memory card connector by overmolding (35) on the flexible printed circuit board (41).

More specifically, the method of manufacture presented amounts to manufacturing a housing to receive a memory card connector which, by overmolding, "envelops" a flexible printed circuit board, of which the conductive track or tracks constitute a protective lattice capable of detecting an intrusion.

Figure 4A:
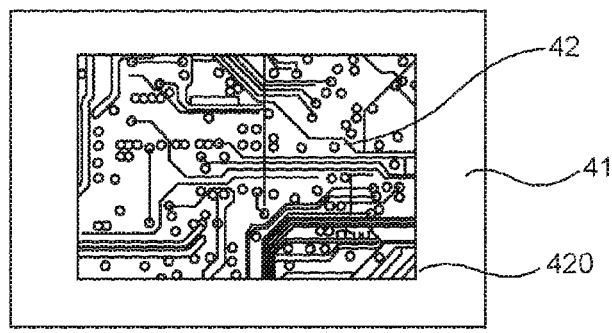
FIGS. 4A to 4H illustrate the different steps of the method of manufacture according to the described technique.

Thus, we obtain (31) first of all a flexible printed circuit board (41) as shown in FIG. 4A.

This flexible printed circuit board (41) comprises especially at least one conductive track forming a protection lattice used to detect intrusion by a damaging instrument.

Figure 4B:
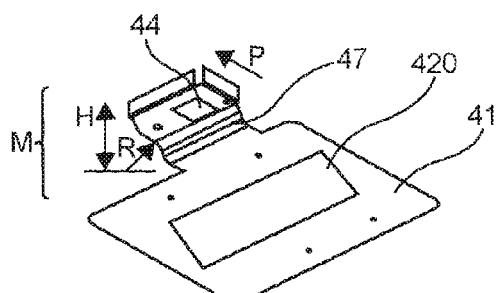
Figure 5A:
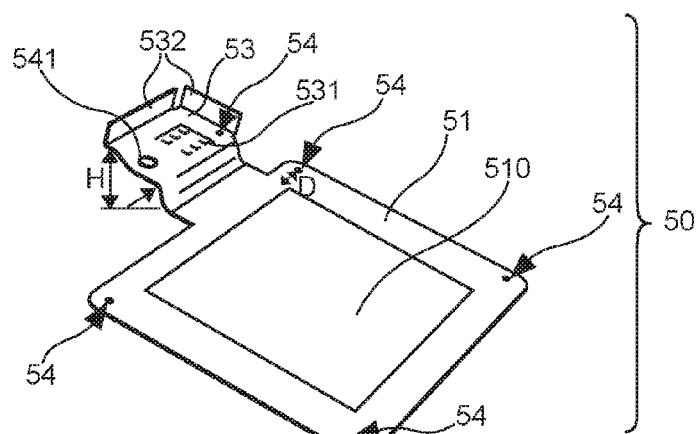
FIGS. 5A to 5C illustrate different parts of the memory card reader body according to the technique described.

Besides, the flexible printed circuit board also comprises a contact zone (44) shown in FIG. 4B. For example, this zone comprises six connection points or connection pins 531 as shown in FIG. 5A which illustrates the flexible printed circuit board of the reception housing for the memory card connector obtained at the end of the implementing of the manufacturing method according to the technique presented herein. The structural aspect of the reader body obtained by the manufacturing method shall be described with greater precision here below.

Figure 6:
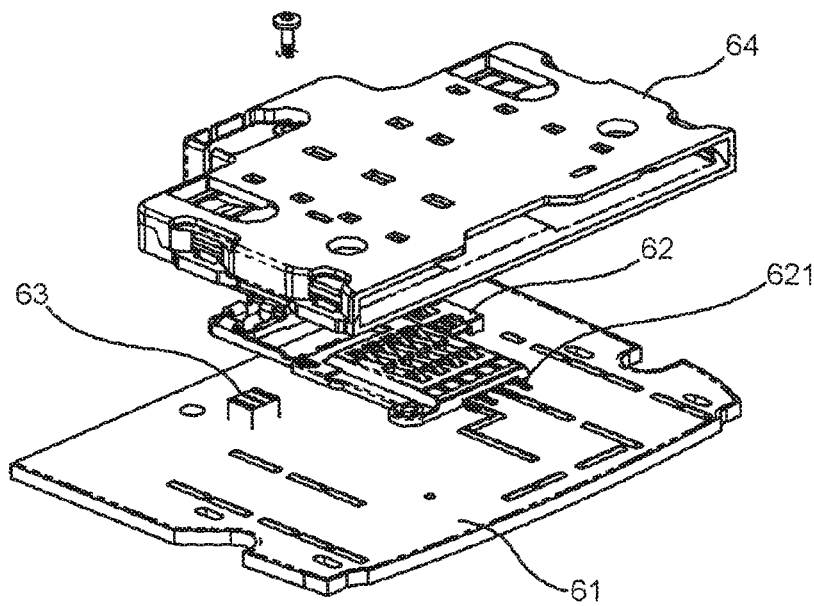
FIG. 6 illustrates the assembling of a memory card reader terminal comprising a reader body manufactured according to the described technique.
Figure 2C:
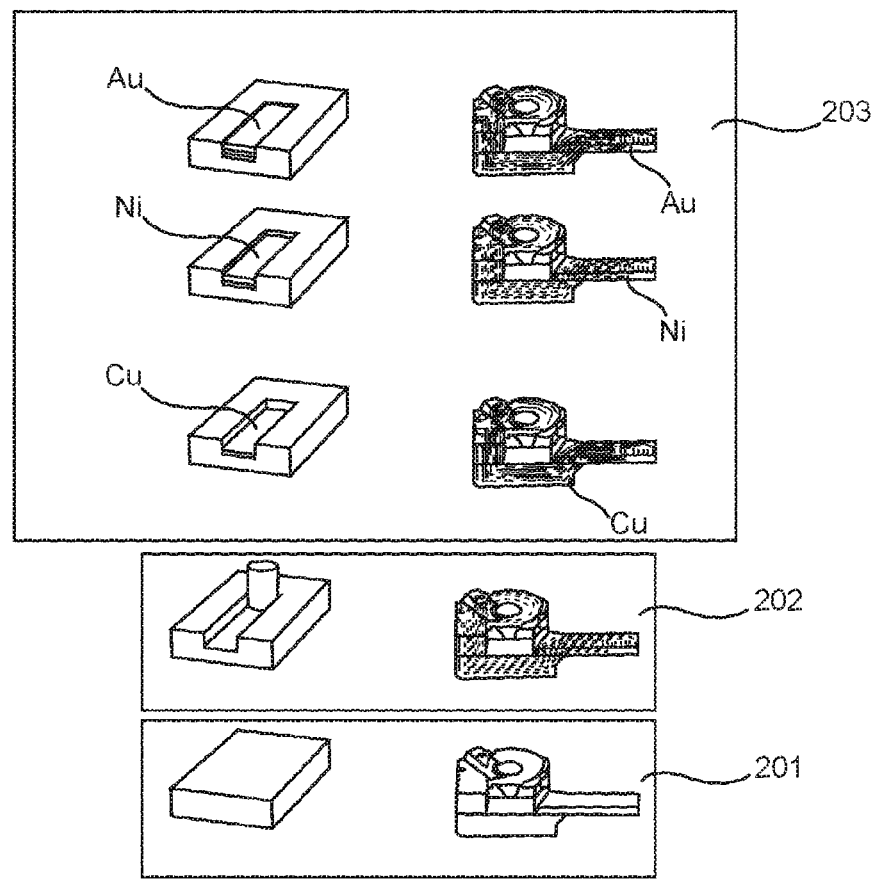

This contact zone is used especially to avoid the problems related to the soldering of the protection lattice of the flexible printed circuit board 41 (on the internal face of the body of the memory card connector) to the printed circuit board 61 (or printed circuit board (PCB)) bearing electronic components of the memory card reader as shown in FIG. 6. This figure illustrates the assembling of a memory card reading terminal comprising a reader body manufactured according to the technique described.

Indeed, in the memory card reader body, there are two distinct printed circuit boards, one (61) dedicated to the electronic components fulfilling the electronic operation of the memory card reader such as the memory card connector and the other (41) dedicated to the protection lattice for the I/O signal travelling between the memory card (smartcard) and the memory card connector, especially the protection of the memory card connector, enabling an intrusion to be detected.

The connection between these two elements is done by means of an elastomer connector, for example of the Zebra (Registered Mark) type (63) as shown in FIG. 6.

Thus, it is not necessary to have available a complex mechanism for soldering the memory card reader body comprising the reception housing obtained by overmolding of the flexible printed circuit board carrying the protection lattice on the PCB comprising the electronic components used for the operation of the memory card reader.

Indeed, since the connection is provided by means of an elastomer connector, the mounting of the assembly formed by the memory card connector, the elastomer connector and the reception housing of the memory card reader body is made easier.

Thus, when the memory card reader is completely assembled, the unit shown in FIG. 6 is obtained.

The advantage of the flexible printed circuit board 41 is that its flexibility enables its shape to match the shape of the desired model of the reception housing of a memory card connector.

This shape can be directly fixed during the overmolding step (35) enabling the shaping of the reception housing. In this case, the flexible printed circuit board available will have been provided with a size and a special shape in order to be able to directly pass to the overmolding operation. Such a flexible printed circuit board which is directly usable for overmolding is for example represented by FIGS. 4B and 5A.

Optionally, it is also possible to implement steps for cutting out (32), folding (34) and drilling (33) between the step (31) for obtaining the flexible printed circuit board and the overmolding step.

These optional steps, shown in dashes in FIG. 3, can be performed one after the other in any unspecified order.

Figure 4D:
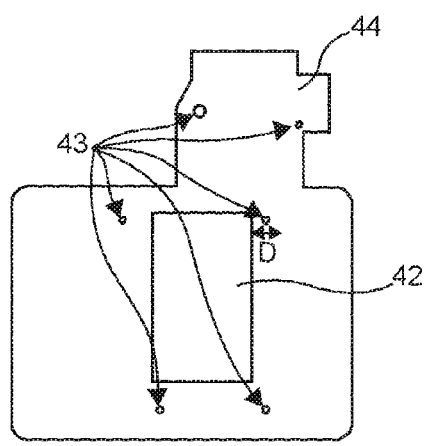
Figure 4C:
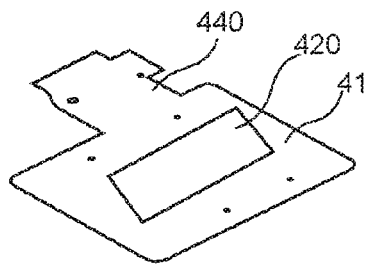

For example, with reference to FIG. 3, starting with a flexible printed circuit board (41) as shown in FIG. 4A illustrating the step for obtaining (31), the cutting-out operation (32) is carried out to obtain the shape of the flexible printed circuit board 41 as shown in FIG. 4C illustrating the step (32) for cutting out. This flexible printed circuit board 41 comprises a drop or interruption (440) which will thereafter be dedicated to isolating the contact zone (44) during the overmolding as described in detail here below.

This cutting-out step thus makes it possible to adapt the shape or the volume of the memory card reader body manufactured according to the invention, this shape possibly varying from one memory card reader model to another.

Figure 4E:
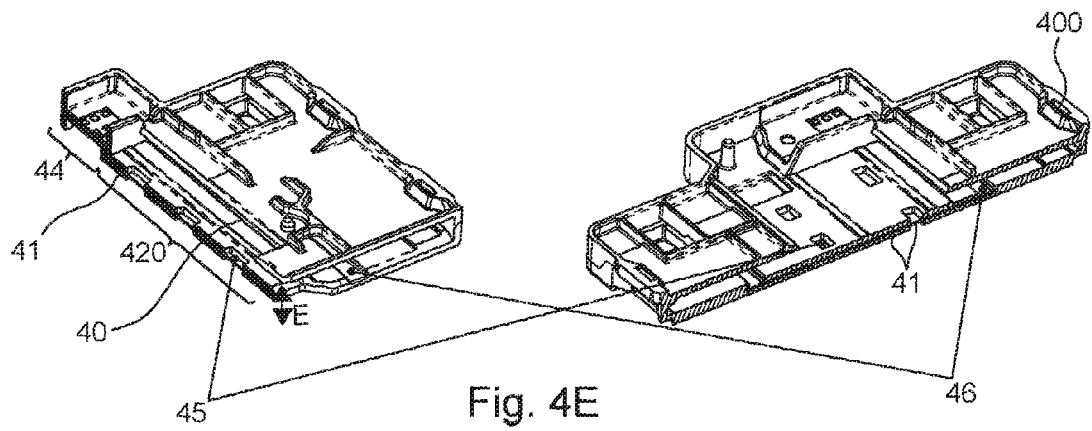
Figure 4F:
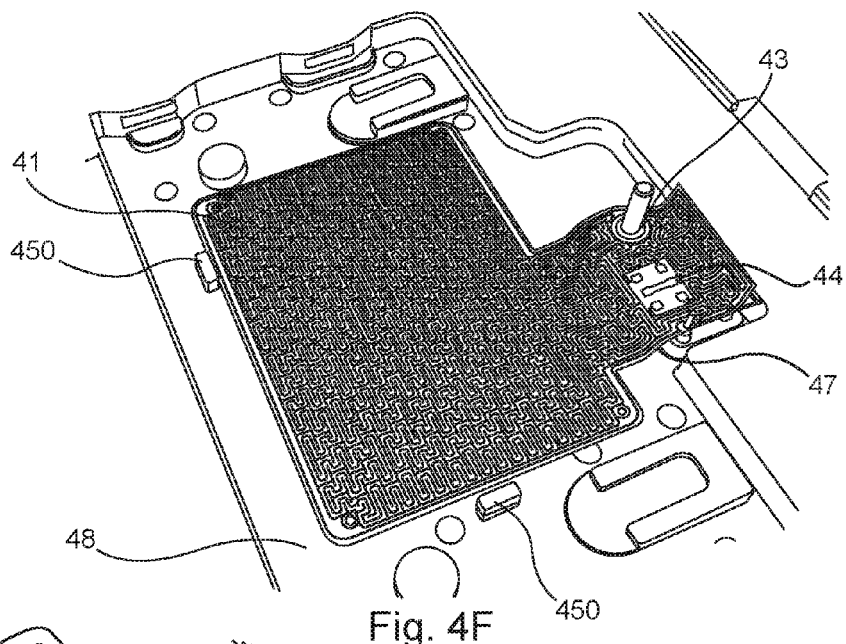

Once the optional cutting out has been done, the operation proceeds to the drilling (33) of at least one positioning aperture (43) in the flexible printed circuit board, the positioning aperture being taken into account for the step for shaping the reception housing by overmolding on the flexible printed circuit board as illustrated by FIG. 4F.

Such apertures can also be drilled preliminarily so as to improve the precision of folding of the flexible printed circuit board, or the precision of shaping of the reception housing (40) by overmolding. Such positioning apertures (43) are for example shown in FIG. 4D and increase the precision of the overmolding.

With reference to the example of FIG. 4D, six positioning apertures are for example drilled in the flexible printed circuit board.

Once the drilling (33) is done, the method proceeds to the folding (34) of the flexible printed circuit board as represented by FIG. 4B illustrating the folding step (34). This step enables the "pre-shaping" of the flexible printed circuit board in order to more easily obtain the desired shape of the reception housing constituting the memory card reader body at the end of the overmolding step.

The folding makes it possible to define tabs or drops M with a height H (for example of the order of 1.5 mm) in the flexible printed circuit board so that it adheres more efficiently to the overmolding mold but also provides lateral protection against fraudulent access.

For example, in a sectional view, these drops show, instead of a right angle, a rounded edge with a radius R of 0.5 mm to 1.5 mm. A range of radius of 0.5 mm to 0.6 mm makes it possible especially to limit the amount of space taken up by the reception housing obtained by overmolding on the flexible printed circuit board thus folded.

However, a range of radii from 1.2 mm to 1.5 mm improves the repeatability of the manufacturing method presented. In this case, in order to manufacture a flat memory card reader body or even an ultra-flat memory card reader body, the depth P of the drop formed by the contact zone of the flexible printed circuit board is elongated.

It must be noted that the folding is done on the already shaped flexible printed circuit board. Thus, to avoid "descending" into the drop or step, no electrical track is diverted. On the contrary, according to the technique proposed herein, the conductive tracks of the flexible printed circuit board forming the lattice "travel across" the drop M with a height H, in other words conductive tracks "start" in the contact zone (or the connection zone) 44, "descend" along the fold of the step 47 and continue on the zone carrying the protection lattice 420 as shown in FIG. 4F.

In particular, the aperture 43 situated to the left of the contact zone (44) has a greater diameter than the other five positioning apertures. This positioning aperture 43 situated to the left in the contact zone (44) makes it possible not only to improve the positioning during the overmolding but also to insert a screw aimed at fixedly attaching the Zebra connection 63 described here above and illustrated by FIG. 6. This screw indeed enables the application of a permanent pressure for fixed attachment in time. Such a Zebra element sets up the connection between the flexible printed circuit board (41) carrying the protection lattice (420) and the memory card connector (22).

For example, the diameter of the small apertures of FIG. 4D or 5A is of the order of 0.5 mm while that of the greatest positioning aperture (43, 541) situated to the left in the contact zone (44, 53) enabling fixed attachment with the Zebra by means of a screw is of the order of 1.5 mm.

Advantageously, such positioning apertures are located in proximity to at least one edge of the flexible printed circuit board and at a minimum distance (D) of 10 mm from the conductive track or tracks forming the protection lattice 42.

FIG. 5A shows one embodiment different from the one shown in FIG. 4D in which the four positioning apertures (54) situated on the part (51) of the flexible printed circuit board carrying the protection lattice (510) are located in proximity to the corners of this part and at a distance D from the protection lattice (510) greater than 10 mm.

It must be noted that the same manufacturing result could be obtained if the drilling step were to be performed first of all before the folding step followed by the cutting-out step, or if the folding step were to be done first.

The order of the optional steps for cutting, folding and drilling is therefore the manufacturer's choice. In addition, it is also possible to apply only the cutting-out step and not the optional folding and drilling steps, or two out of three of these optional steps.

Directly after the step for obtaining the flexible printed circuit board, or after one or all the optional steps of drilling (33), folding (34) and cutting out (32) described here above, the method according to the present technique implements the shaping of the reception housing (40) of a memory card connector by overmolding (35) on the flexible printed circuit board (41).

Figure 4G:
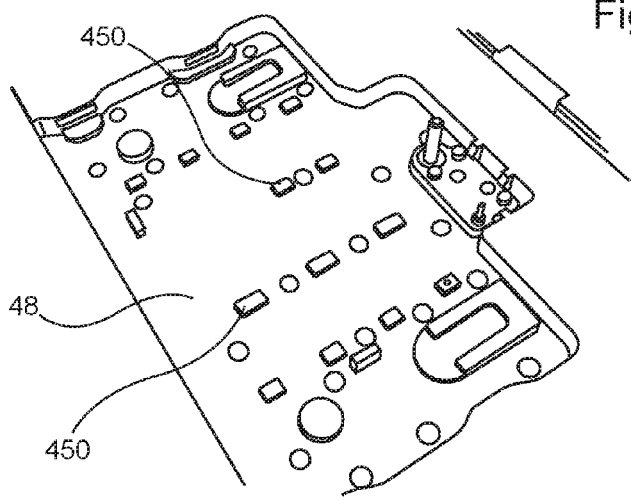

Overmolding is a classic technique and consists in hot-shaping (34) the flexible printed circuit board and then inserting it into a mold (a part 48 of which is shown in FIG. 4G) corresponding to the desired model of the reception housing for memory card connectors and finally overmolding the reception housing by injection of material into the mold 48.

The positioning apertures (43) mentioned here above make it possible for example to stretch the flexible printed circuit board in the mold. Then this printed circuit board is affixed into the mold by means of pins inserted in the positioning apertures and the overmolding is done.

Besides, the overmolding material is for example a classic polycarbonate-based material.

According to one particular embodiment, this material is conductive. For example it is a conductive polycarbonate. This characteristic of the overmolding material advantageously makes it possible to dissipate the electrostatic charges during the insertion of the memory card into the memory card reader body.

At the end of the overmolding step we obtain the memory card reader body as shown according to the sectional view of FIG. 4E.

In FIG. 4E, it can be noted that the zone (420) comprising the conductive track is covered with an overmolding material on both its faces, the thickness of the overmolding material being for example of the order of 0.6 mm on each side of the flexible printed circuit board. We obtain for this zone a total thickness E of the order of 1.5 mm, the thickness of the flexible printed circuit board being of the order of 0.2 mm. The contact zone (44) for its part is coated by an overmolding material on only one face.

In particular, during the overmolding step, holding pins 450 of the mold illustrated by FIG. 4G are used to maintain the flexible printed circuit board 41 in the optimal position by clamping. These pins 450 are protrusions emerging naturally (in other words along the main direction of aperture of the mold) from the overmolding mold in the case of both the fixed part and the mobile part of the pin which clamps the flexible printed circuit board. In addition, the optimal positioning of the flexible printed circuit board 41 during the overmolding is also provided by holding sliders 46 emerging in the manner of slidingly mobile drawers (in other words demolded along a direction different from the main direction of opening of the mold).

Apertures 45 corresponding to the holding pins 450 are therefore obtained in the reception housing delivered by the step of shaping by overmolding as illustrated by FIG. 4E. However, these apertures 45 are not damage-prone relative to the securing of the lattice because they are situated in a central zone of the reception housing which cannot be reached through the slot of the reader. It is therefore impossible to access sensitive signals to be protected through these apertures.

Figure 4H:
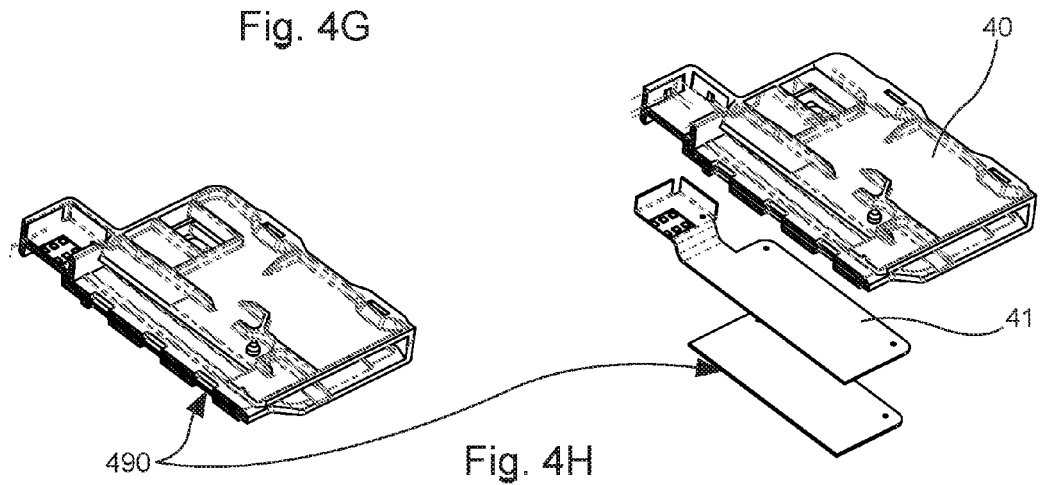
Figure 5B:
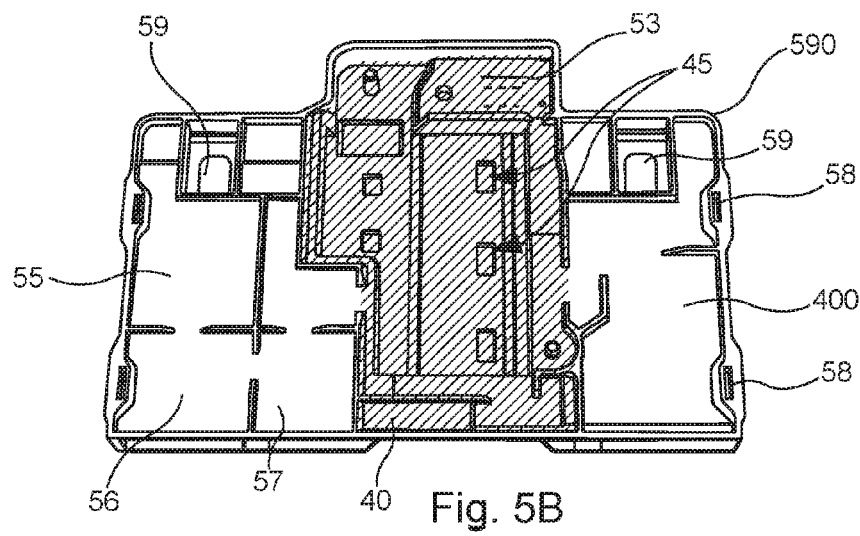
Figure 5C:
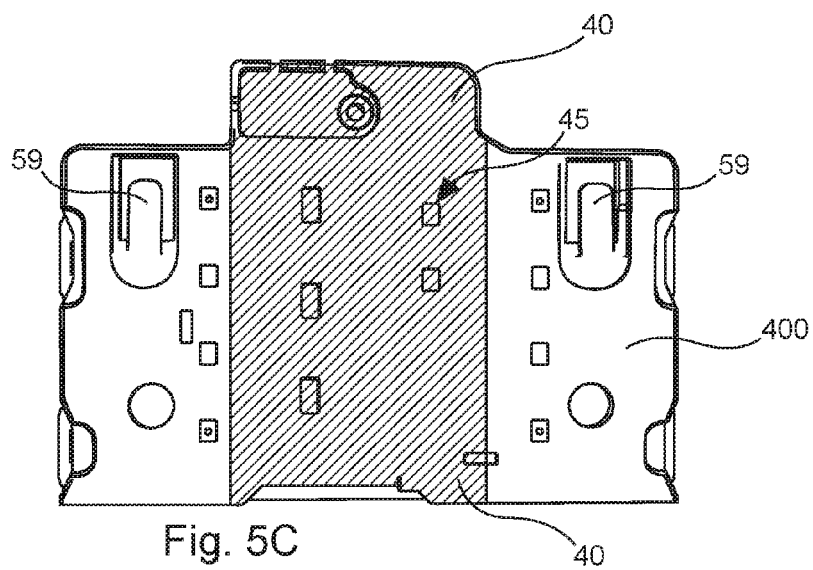

According to one variant of the embodiment, it is also proposed to add on a rigid plate, for example through a fixed attachment with adhesive, beneath the flexible printed circuit board, in order to be in contact with rear face of the reception housing shown in FIG. 5C. This rigid plate 490, for example made of metal, provides rigidity to the unit as represented in FIG. 4H to make the injection process more reliable and prevent excessive deformation of the flexible printed circuit board during the injection.

In particular, FIG. 4H illustrates the fact that the overmolding "envelops" the superimposition constituted by the flexible printed circuit board and a rigid plate, for example a metal plate, fixedly joined to the rear face of the flexible printed circuit board.

Thus the rigid plate is used to limit the deformation of the flexible printed circuit board during the injection and use of higher injection pressures. Hence smaller, and therefore repeatable, overmolding thicknesses (which could be as small as 0.4 mm) are obtained.

In addition, the use of such a rigid plate (490) for example made of metal reinforces security because it becomes extremely difficult to access the signals of the protection lattice located beneath this metal plate (490) even through the previously mentioned apertures 45.

6.2 Description of an Example of a Memory Card Reader Body and a Terminal Obtained by the Method of Manufacture According to the Technique Described Referring to FIGS. 5A to 5C, we present different parts of the memory card reader body according to the technique described.

Besides, FIG. 6 illustrates the assembling of a memory card reader body comprising a reader body manufactured according to the described technique.

Thus, FIG. 5A illustrates the flexible printed circuit board 50 from which the reception housing of the memory card connector will be formed by overmolding.

Such a flexible printed circuit board 50 takes for example the form of a first plane zone 50 comprising the protection lattice 510 constituted by a conductive tracks (not shown) and a second zone called a contact zone 53 raised relative to the plane zone 50 comprising the protection lattice 510. The extra elevation of the contact zone relative to the plane zone corresponds to a drop with a height H and a radius R.

A relief feature of this kind in the flexible printed circuit board is capable of "matching" the shape of the reception housing sought for the memory card reader body.

The contact zone 53 comprises six connection pins or points 531 and two positioning apertures 54 and 541 to improve the positioning of the flexible printed circuit board in the mold used in the overmolding to shape the reception housing (40) of the memory card connector, this reception housing being a part of the memory card reader body.

The positioning aperture 541 has a diameter greater than that of the positioning aperture 54 situated in the contact zone 53 so as to also enable the passage of a screw enabling the fixed joining of an elastomer connector, for example of the Zebra (Registered Mark) type.

On the plane zone 51 comprising the protection lattice 51, the positioning apertures 54 are located in proximity to the edge of the flexible printed circuit board and at a distance D of at least 10 mm from a conductive track of the protection lattice 510.

FIGS. 5B and 5C present a part of the internal and external sides of the rear face (400) of the memory card reader body manufactured according to the technique described.

The reception housing of the memory card connector (40) is represented in hatched lines and corresponds to a part of the memory card reader body.

This reception housing (40) is obtained by overmolding of the flexible printed circuit board (50) represented in FIG. 5A. Thus, the flat zone (51) comprising the protection lattice is "enveloped" by the overmolding material forming the reception housing (40).

In the view of the external side of the part of the rear face (400) of the memory card reader body shown in FIG. 5C, it can be seen that the overmolding material covers both faces of the plane zone (51) of the flexible printed circuit board.

On the contrary, the contact zone is properly covered, and by that very fact protected, on the external face of the memory card reader body but uncovered on the internal face in order to set up contact between the memory card connector which the reception housing (40) is capable of receiving.

It can also be noted that the rear face of the memory card reader body according to the technique described comprises different compartments 55, 56 and 57 capable of receiving different components.

In addition, the memory card reader body also comprises apertures 58 for the insertion of metal anchoring pins (not shown), soldered with brazing paste, that fix the PCB (61), dedicated to the electronic components fulfilling the electronic functioning of the memory card reader such as the memory card connector, to the memory card reader body. Such metal anchoring pins hold the connector during the repeated insertions of the memory card in the memory card reader. These metal anchoring pins can also take a particular shape adapted on the one hand to fulfilling a guiding function for the memory card in the reader and, on the other hand, to carrying out, if necessary, an electronic discharge of the ridges of the inserted card.

Besides, the memory card reader body also comprises tabs 59 made of overmolding material, for example a conductive polycarbonate. These tabs, according to one embodiment, also enable an electrostatic discharge of the memory card when it is fully inserted into the card reader so as to come into contact with the upper edge 590 of the memory card reader body.

Referring to FIG. 6, we present the assembling of a memory card reader terminal comprising a reader body manufactured according to the technique described.

This assembling amounts especially to superimposing:
- a first printed circuit board body 61 dedicated to the electronic components carrying out the electrical functioning of the memory card reader such as the memory card connector,
- a memory card connector 62 comprising especially metal leaf blades, on one (621) of which there travels the I/O signal between the memory card (smartcard) and the memory card connector,
- a Zebra element 63 used to set up a connection between the flexible printed circuit board comprising at least one contact zone 53 uncovered on the internal side and a flat zone carrying the protection lattice 51 overmolded on both of its faces by the overmolding material forming the reception housing 40 and the memory card connector 62,
- the external side of the rear face 64 of the memory card reader body as already shown in FIG. 5C comprising the reception housing 40 overmolded on the flexible printed circuit board comprising at least one contact zone 53 uncovered on the internal side and on a plane zone carrying the protection lattice 51.

Although the present disclosure has been described with reference to one or more examples, workers skilled in the art will recognize that changes may be made in form and detail without departing from the scope of the disclosure and/or the appended claims.

The invention claimed is:

1. A method for manufacturing a memory card reader body with a generally rectangular parallelepiped shape comprising a slot for inserting a memory card, one rear face of which comprises a reception housing for a memory card connector, said reception housing being of predetermined volume shape,
   wherein said method for manufacturing comprises the following successive steps:
   obtaining a flexible printed circuit board comprising at least two zones:

a zone comprising at least one conductive track forming a protection lattice capable of detecting an intrusion, and at least one contact zone, forming said reception housing by overmolding of said flexible printed circuit board.

2. The method for manufacturing according to claim 1, wherein the method comprises cutting out said flexible printed circuit board.

3. The method for manufacturing according to claim 1, wherein said step of forming said reception housing by overmolding of said flexible printed circuit board comprises fixedly attaching a rigid plate beneath said flexible printed circuit board, wherein fixedly attaching is implemented prior to said overmolding.

4. The method for manufacturing according to claim 1, wherein the method comprises drilling at least one positioning aperture in the flexible printed circuit board, said positioning aperture being taken into account for said step of forming said reception housing by overmolding of said flexible printed circuit board and/or a step of folding said flexible printed circuit board.

5. The method for manufacturing according to claim 4, wherein said at least one positioning aperture is located in proximity to at least one edge of said flexible printed circuit board and at a minimum distance of 10 mm from said at least one conductive track.

6. The method for manufacturing according to claim 1, wherein said overmolding is such that:

said zone comprising at least one conductive track is covered with an overmolding material on both its faces, said contact zone is covered with an overmolding material on only one face.

7. The method for manufacturing according to claim 6, wherein said overmolding material is a conductive or dissipative material.

8. A memory card reader body comprising:

of a generally rectangular parallelepiped shape comprising a slot for inserting a memory card, a rear face of which comprises a reception housing for a memory card connector, said reception housing having a predetermined volume shape, wherein said reception housing is an overmolding of a flexible printed circuit board comprising at least two zones:

a zone comprising at least one conductive track forming a protection lattice capable of detecting an intrusion, and at least one contact zone.

9. The memory card reader body according to claim 8, comprising at least one positioning aperture in said flexible printed circuit board.

10. A memory card reading terminal comprising the card reader body according to claim 8.

* * * * *